United States Patent
Tsai et al.

(10) Patent No.: US 8,138,518 B2
(45) Date of Patent: Mar. 20, 2012

(54) LIGHT EMITTING DIODE, PACKAGE STRUCTURE AND MANUFACTURING METHOD THEREOF

(75) Inventors: Yao-Jun Tsai, Taoyuan County (TW);
Jinn-Kong Sheu, Tainan (TW);
Hsi-Hsuan Yen, Taipei (TW);
Hung-Lieh Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 130 days.

(21) Appl. No.: 12/419,299

(22) Filed: Apr. 7, 2009

(65) Prior Publication Data
US 2010/0072487 A1    Mar. 25, 2010

(30) Foreign Application Priority Data
Sep. 22, 2008    (TW) ................................ 97136352 A

(51) Int. Cl.
*H01L 33/00* (2010.01)
(52) U.S. Cl. ............... 257/99; 257/86; 257/98; 257/100
(58) Field of Classification Search ...... 257/86, 257/94, 98, 99, 100, 91, 778, 87
See application file for complete search history.

(56) References Cited

U.S. PATENT DOCUMENTS

| | | | |
|---|---|---|---|
| 6,555,405 B2 | 4/2003 | Chen et al. | |
| 6,797,987 B2* | 9/2004 | Chen | 257/98 |
| 6,847,057 B1* | 1/2005 | Gardner et al. | 257/99 |
| 7,078,736 B2* | 7/2006 | Lin et al. | 257/98 |
| 7,109,529 B2* | 9/2006 | Uemura et al. | 257/99 |
| 7,592,637 B2* | 9/2009 | Zimmerman et al. | 257/98 |
| 2005/0087884 A1* | 4/2005 | Stokes et al. | 257/778 |
| 2005/0184300 A1 | 8/2005 | Tazima et al. | |
| 2005/0269588 A1* | 12/2005 | Kim et al. | 257/99 |
| 2007/0194325 A1 | 8/2007 | Sung et al. | |
| 2008/0135867 A1* | 6/2008 | Feng et al. | 257/99 |

* cited by examiner

*Primary Examiner* — Wael Fahmy
*Assistant Examiner* — Bilkis Jahan
(74) *Attorney, Agent, or Firm* — Jianq Chyun IP Office

(57) ABSTRACT

A light emitting diode (LED), a fabricating method thereof, and a package structure thereof are provided. The LED includes a substrate, a first semiconductor layer disposed on the substrate, an active layer disposed on the first semiconductor layer, a second semiconductor layer disposed on the active layer, a current distribution modifying layer, a first electrode and a second electrode. The active layer and the second semiconductor layer form a mesa structure and expose a part of the first semiconductor layer. The current distribution modifying layer is disposed on the second semiconductor layer. The first electrode is disposed on and electrically connected to the first semiconductor layer exposed by the mesa structure. The second electrode is disposed on the current distribution modifying layer and is electrically connected to the second semiconductor layer. The LED has superior light emitting efficiency.

19 Claims, 24 Drawing Sheets

LIGHT EMITTING DIODE, PACKAGE STRUCTURE AND MANUFACTURING METHOD THEREOF

CROSS-REFERENCE TO RELATED APPLICATION

This application claims the priority benefit of Taiwan application serial no. 97136352, filed on Sep. 22, 2008. The entirety of the above-mentioned patent application is hereby incorporated by reference herein and made a part of specification.

BACKGROUND OF THE INVENTION

1. Field of the Invention

The present invention relates to a light emitting device and a fabricating method thereof. More specifically, the present invention relates to a light emitting diode (LED), a package structure thereof and a fabricating method thereof.

2. Description of Related Art

An LED is a semiconductor device. A material of light-emitting chips in the LED is generally selected from group III-V chemical elements such as GaP, GaAs, GaN, and other compound semiconductors. The light emitting principle lies in converting electric energy into light. In other words, by applying currents to the compound semiconductors, and through the combinations of electrons and electron holes, redundant energy is released in forms of light, so that light emitting effects are achieved.

The structure of the LED usually comprises a substrate, two semiconductor layers, an active layer, which is the light emitting layer, disposed between the two semiconductor layers and two external electrodes. When a forward bias voltage is applied to the external electrodes, current flows through the semiconductor layers, and combinations of electrons and electron holes are formed in the active layer, so that the active layer emits light.

As light emitting efficiencies increase, the LED has gradually replaced conventional fluorescent lamps and incandescent bulbs in application, and the fabrication of the LED is gradually developing towards trends of high power and large area. However, in the prior art, since the design of the electrodes in the LED is not of ideal disposition, currents are not uniform when the LED is driven, leading to inferior light emitting efficiencies of the LED. This problem is especially manifest on the edges of the electrodes, and may cause the electrodes or the nearby semiconductor layers to be destroyed. In addition, since the electrodes are not transparent, for some kinds of LEDs, light emitted from the active layer may be blocked or absorbed by the electrodes, thereby affecting the light emitting efficiencies of the LEDs.

SUMMARY OF THE INVENTION

In order to describe the present disclosure, an LED is hereby provided, which mainly comprises a substrate, a first semiconductor layer, an active layer, a second semiconductor layer, a current distribution modifying layer including a plurality of patterns, a first electrode and a second electrode. The first semiconductor layer is disposed on the substrate, the active layer is disposed on the first semiconductor layer, and the second semiconductor layer is disposed on the active layer. In addition, the active layer and the second semiconductor layer form a mesa structure, and the mesa structure exposes a part of the first semiconductor layer. Furthermore, the current distribution modifying layer is disposed on the second semiconductor layer, while the first electrode is disposed on the first semiconductor layer exposed by the mesa structure, and is electrically connected to the first semiconductor layer. The second electrode is disposed on the current distribution modifying layer, and is electrically connected to the second semiconductor layer.

A package structure of an LED is further provided, which comprises an LED device, a package substrate and a plurality of electrical connection units. The LED device comprises a first semiconductor layer, an active layer, a second semiconductor layer, a current distribution modifying layer including a plurality of patterns, a first electrode and a second electrode. The active layer is disposed on the first semiconductor layer, and the second semiconductor layer is disposed on the active layer. In addition, the active layer and the second semiconductor layer form a mesa structure, and the mesa structure exposes a part of the first semiconductor layer. The current distribution modifying layer is disposed on the second semiconductor layer, while the first electrode is disposed on the first semiconductor layer exposed by the mesa structure, and is electrically connected to the first semiconductor layer. The second electrode is disposed on the current distribution modifying layer, and is electrically connected to the second semiconductor layer. The above package substrate comprises a first contact and a second contact, which face the first electrode and the second electrode of the LED device. The first contact and the second contact are respectively electrically connected to the first electrode and the second electrode through the electrical connection units.

A method of fabricating an LED is further provided. First, a substrate is provided, and a first semiconductor layer, an active layer and a second semiconductor layer are formed on the substrate, wherein the first semiconductor layer is disposed on the substrate, the active layer is disposed on the first semiconductor layer, and the second semiconductor layer is disposed on the active layer. Next, the second semiconductor layer and the active layer are patterned, so that the second semiconductor layer and the active layer expose a part of the first semiconductor layer and form a current distribution modifying layer including a plurality of patterns on the second semiconductor layer. Then, a second electrode is formed on the second semiconductor layer, so that the second electrode is electrically connected to the second semiconductor layer, and a first electrode is formed on the first semiconductor layer exposed by the active layer and the second semiconductor layer, so that the first electrode is electrically connected to the first semiconductor layer.

Due to the above, the present disclosure forms the current distribution modifying layer in the LED to improve a current distribution in the LED, so that light emitting efficiency and reliability of the LED is enhanced. In addition, the present disclosure uses the film chip method to dispose the LED on the package substrate to provide full-scale light emitting effects unobstructed by the electrodes, so that the light emitting efficiency is enhanced.

In order to make the above and other objects, features and advantages of the present disclosure more comprehensible, several embodiments accompanied with figures are described in detail below.

DESCRIPTION OF EMBODIMENTS

Figure 1:
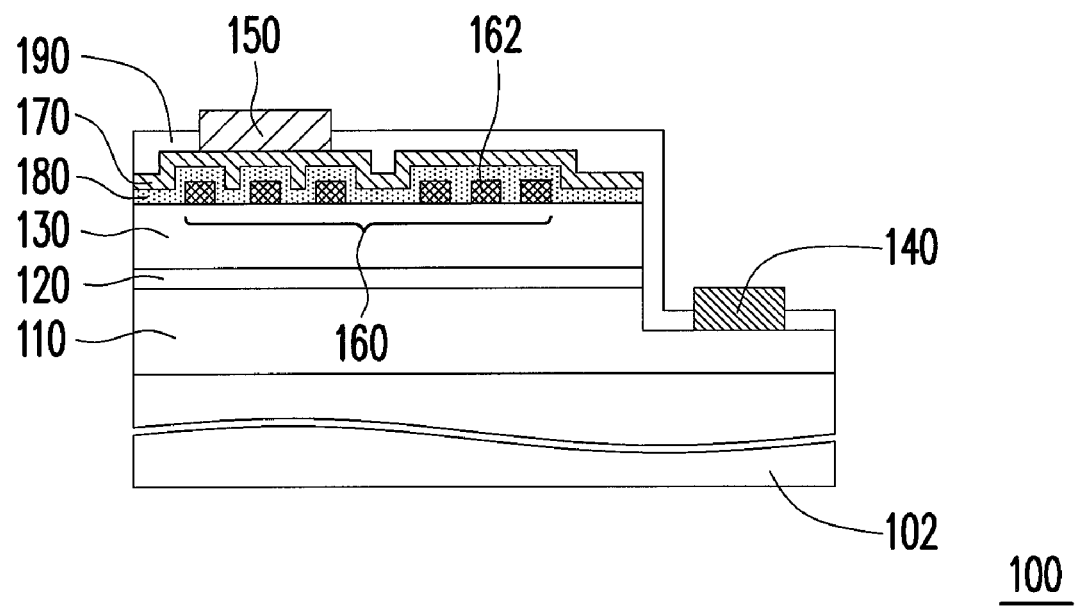
FIG. 1 is a view illustrating an LED according to an embodiment of the present disclosure.

An LED and a fabricating method thereof in the present disclosure are described below by means of a plurality of embodiment, and a package structure of the LED is further introduced. It should be noted that, detailed structures or steps exemplified according to the following different embodiments can be combined, replaced or omitted under reasonable circumstances to meet different practical needs. A person having ordinary skill in the art should comprehend the spirit and the technical features of the present disclosure after studying the following embodiments, and can perform reasonable modifications and applications without departing from the scope of the present disclosure. In addition, in order to illustrate simply and render the illustrations more comprehensible, the following uses the same reference numerals for similar components and omits repetitive descriptions.

FIG. 1 is a view illustrating an LED according to an embodiment of the present disclosure. Referring to FIG. 1, an LED 100 comprises a substrate 102, a first semiconductor layer 110, an active layer 120, a second semiconductor layer 130, a first electrode 140 and a second electrode 150. A material of the substrate 102 is sapphire, for example, or other suitable materials. An epitaxy method is used to fabricate the first semiconductor layer 110, the active layer 120 and the second semiconductor layer 130 on the substrate 102 sequentially. The formed active layer 120 and the second semiconductor layer 130 are patterned and form a mesa structure, so that a part of the first semiconductor layer 110 is exposed. A part of the exposed first semiconductor layer 110 is also removed.

It should be noted that, the first semiconductor layer 110 and the second semiconductor layer 130 may be formed by a plurality of semiconductor material layers of different properties. For example, the first semiconductor layer 110 may comprise an N-type doped semiconductor layer and an undoped semiconductor layer, while the second semiconductor layer 130 may comprises a P-type doped semiconductor layer, and the P-type doped semiconductor layer may have a tunneling junction. However, the above material layers are only used as examples. The present disclosure is not limited to an actual combination of the first semiconductor layer 110 and the second semiconductor layer 130. A person skilled in the art may adjust the composition of the first semiconductor layer 110 and the second semiconductor layer 130 within reasonable ranges to comply with actual designs and requirements.

Still referring to FIG. 1, in order to improve a current distribution in the LED 100, according to the present embodiment, a current distribution modifying layer 160 including of a plurality of patterns 162 is further disposed on a surface of the second semiconductor layer 130. The purpose of disposing the current distribution modifying layer 160 is to form a rough surface or uneven structure on the second semiconductor layer 130, so that impedance of the area is changed and an effect of improving the current distribution is achieved. Therefore, energy loss and destruction caused by crowding effects are effectively avoided, and light emitting efficiency of the LED 100 is enhanced. In addition, since the current distribution modifying layer 160 has the rough surface or the uneven structure, a light scattering effect in the LED 100 is enhanced, so that light emission is more uniform. Of course, shapes, numbers or positions of the patterns 162 require prior design or verification. In application, a structure parameter of the patterns 162 may be adjusted according to actual circumstances.

The first electrode 140 is disposed on the first semiconductor layer 110 exposed by the active layer 120 and the second semiconductor layer 130, and is electrically connected to the first semiconductor layer 110. In addition, the second electrode 150 is disposed on the second semiconductor layer 130, and is electrically connected to the second semiconductor layer 130. When a forward bias voltage is applied through the first electrode 140 and the second electrode 150, a current flows through the first semiconductor layer 110, the second semiconductor layer 130 and the current distribution modifying layer 160, and forms combinations of electrons and electron holes in the active layer 120, so that light is emitted and output through the substrate 102 of the LED 100.

According to the present embodiment, the LED may also comprise a metallic reflective layer 170, disposed between the second electrode 150 and the second semiconductor layer 130 and covering the current distribution modifying layer 160. The metallic reflective layer 170 facilitates reflecting light emitted from the active layer 120, thereby enhancing light emitting efficiency of the LED 100. In addition, the LED may further comprise an ohmic contact layer 180, disposed between the metallic layer 170 and the second semiconductor layer 130 and covering the current distribution modifying layer 160. The ohmic contact layer 180 facilitates lowering contact impedance between the metallic reflective layer 170 and the second semiconductor layer 130.

According to the present embodiment, in order to avoid external moisture or impurities entering the LED or contaminating surface layers thereof, a protection layer 190 may cover the first semiconductor layer 110, the active layer 120 and the second semiconductor layer 130. The protection layer 190 exposes the first electrode 140 and the second electrode 150, so that the first electrode 140 and the second electrode 150 are connected to an external power source.

According to the above embodiment, the current distribution modifying layer 160 may have a plurality of different forms, such as a plurality of protrusions protruding from the second semiconductor layer 130 or a plurality of recesses in the second semiconductor layer 130. The above recesses are formed, for example, by performing patterning processes such as etching on the second semiconductor layer. In addition, the protrusions may be formed by additionally depositing and patterning a material layer on the second semiconductor layer 130, or by directly patterning the ohmic contact layer 180. A material of the protrusions may be insulating material, for example, selected from a group consisting of SiO$_2$, SiN$_x$, AN, SiO$_x$N$_y$, and Ga$_2$O$_3$, or ohmic contact materials. Furthermore, the protrusions of the current distribution modifying layer 160 may also have multiple layer structures. In other words, the current distribution modifying layer 160 may comprise a plurality of material layers that have materials of combinations of the above possible materials.

The following further uses a plurality of embodiments to illustrate a fabricating method of the LED 100, and exemplifies possible structures and fabricating methods of the current distribution modifying layer 160 according to the embodiments.

Exemplifying fabricating the above LED 100, FIGS. 2A to 2G show a process flowchart of fabricating an LED according to an embodiment of the present disclosure. The present embodiment uses the same reference numerals for similar components, and omits repeated description.

Figure 2A:
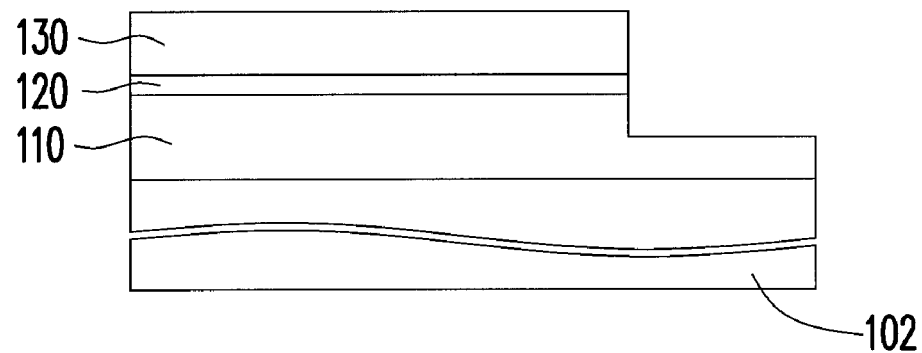
FIGS. 2A to 2G are views illustrating a process flowchart according to an embodiment of the present disclosure.

First, referring to FIG. 2A, the substrate 102 is provided, and the epitaxy method is performed on the substrate. Ion doping is selectively performed to form the first semiconductor layer 110, the active layer 120 and the second semiconductor layer 130 sequentially. As according to the above embodiment, the formed first semiconductor layer 110 and the second semiconductor layer 130 may respectively comprise an N-type doped semiconductor layer and a P-type doped semiconductor layer, or other combinations of layers.

Figure 2B:
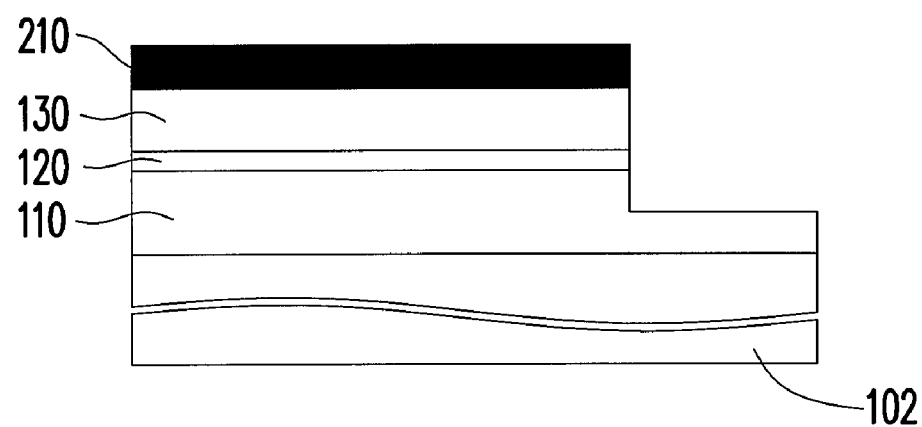

Next, referring to FIG. 2B, parts of the second semiconductor layer 130 and the active layer 120 are removed, so that the part of first semiconductor layer 110 exposed by the second semiconductor layer 130 and the active layer 120 forms the mesa structure. In detail, a mask layer 210, for example a photoresist layer, may be formed on the second semiconductor layer 130. Patterning processes such as etching are performed using the mask layer 210 to remove the parts of the second semiconductor layer 130 and the active layer 120. It should be noted that, during the patterning processes, a part of the first semiconductor layer 110 exposed by the mask layer 210 may be overly etched.

Figure 2C:
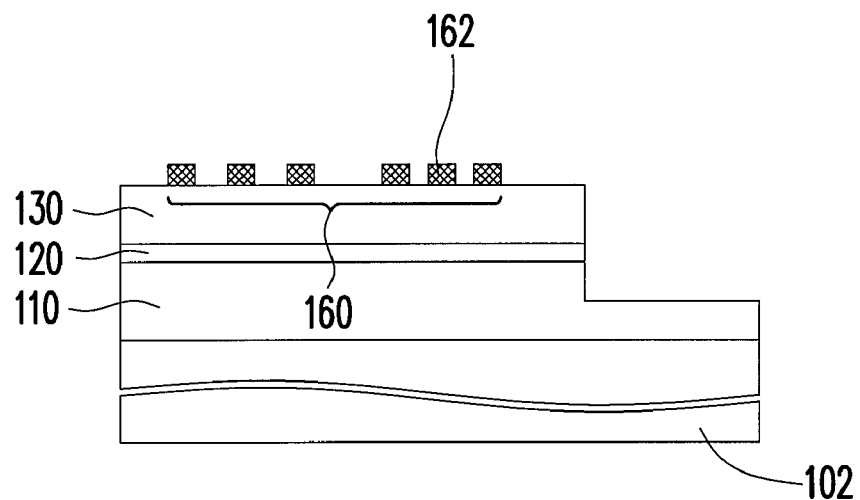

Next, referring to FIG. 2C, the current distribution modifying layer 160 is formed on the second semiconductor layer 130. The current distribution modifying layer 160 formed on this position comprise a plurality of protrusions 162. In this step, the above mask layer 210 may be removed first, and the material layer is additionally formed on the second semiconductor layer 130. The material layer is then patterned to obtain the current distribution modifying layer 160. Alternatively, the current distribution modifying pattern 160 may also be formed by directly patterning the mask layer 210. In addition, according to the above embodiment, the patterns 162 on the current distribution modifying layer 160 may also have multiple layer structures, which means that after the plurality of material layers are formed on the second semiconductor layer 130, the material layers are patterned to from the patterns 162.

Figure 2D:
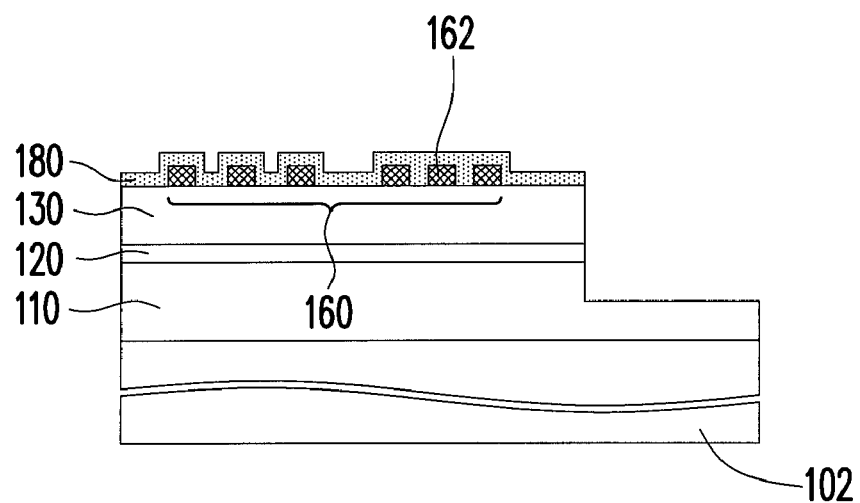
Figure 2E:
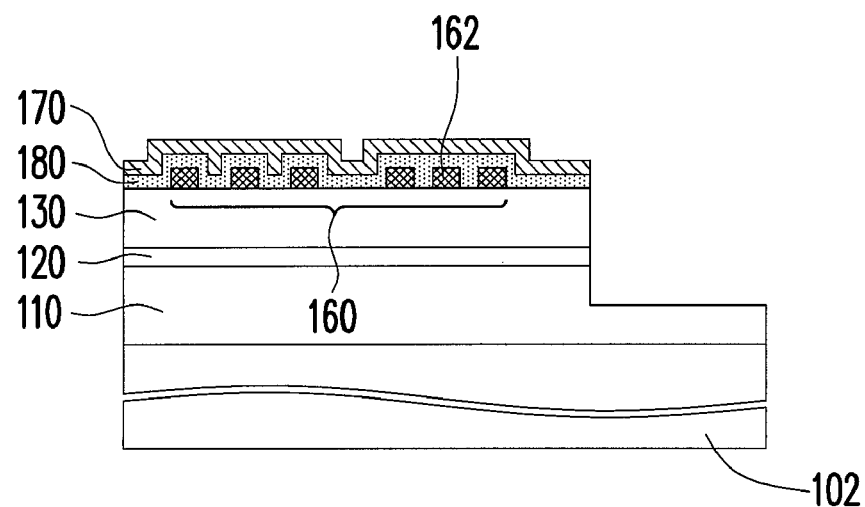

Then, referring to FIGS. 2D and 2E, according to the present embodiment, the ohmic contact layer 180 and the metallic reflective layer 170 may be selectively formed sequentially on the second semiconductor layer 130, wherein the ohmic contact layer 180 lowers the contact impedance between the metallic reflective layer 170 and the second semiconductor layer 130.

Figure 2F:
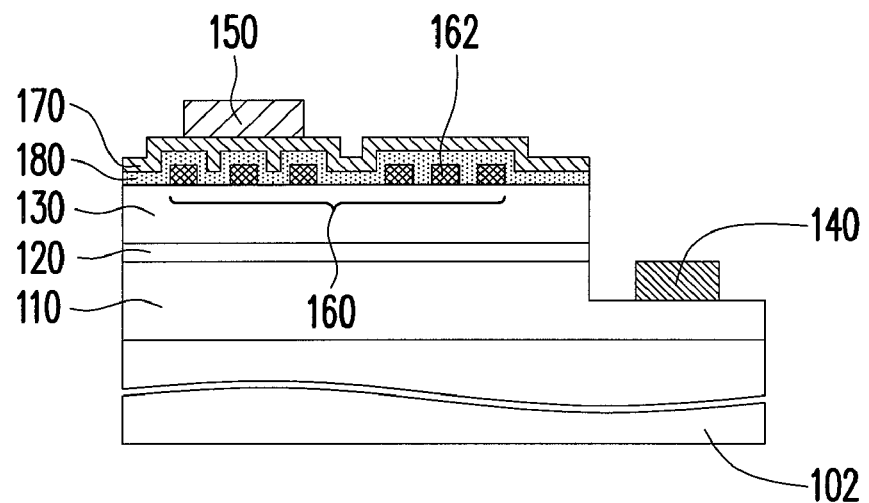

Next, referring to FIG. 2F, the second electrode 150 is formed on the second semiconductor layer 130, so that the second electrode 150 is electrically connected to the second semiconductor layer 130. Furthermore, the first electrode 140 is formed on the first semiconductor layer 110 exposed by the active layer 120 and the second semiconductor layer 130, and the first electrode 140 is electrically connected to the first semiconductor layer 110. It is noted that, the first electrode 140 and the second electrode 150 may be formed simultaneously, or alone, to be used as pads connected to the exterior. In addition, according to the present embodiment, an ohmic contact layer (not shown) may also be formed between the first electrode 140 and the first semiconductor layer 110 to further lower contact impedance between the first electrode 140 and the first semiconductor layer 110.

Figure 2G:
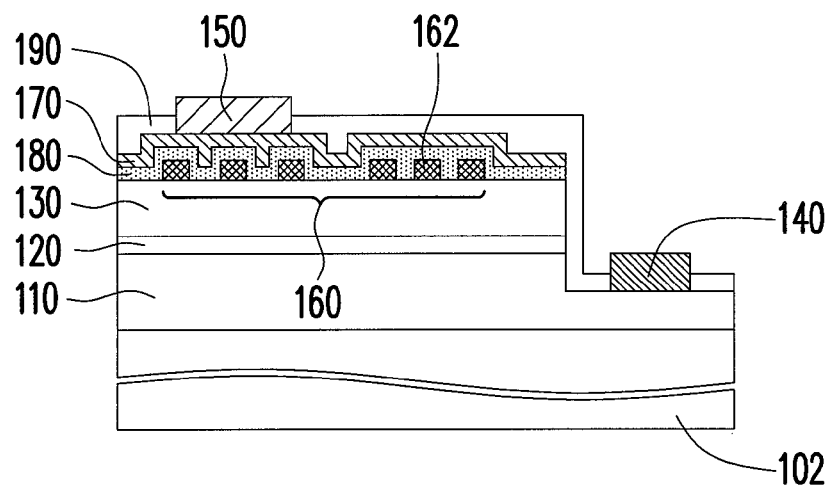

Afterwards, referring to FIG. 2G and according to the present embodiment, the protection layer 190 may be selectively formed to cover the first semiconductor layer 110, the active layer 120 and the second semiconductor layer 130, and expose the first electrode 140 and the second electrode 150. Accordingly, the fabrication of the LED 100 is complete.

Figure 3:
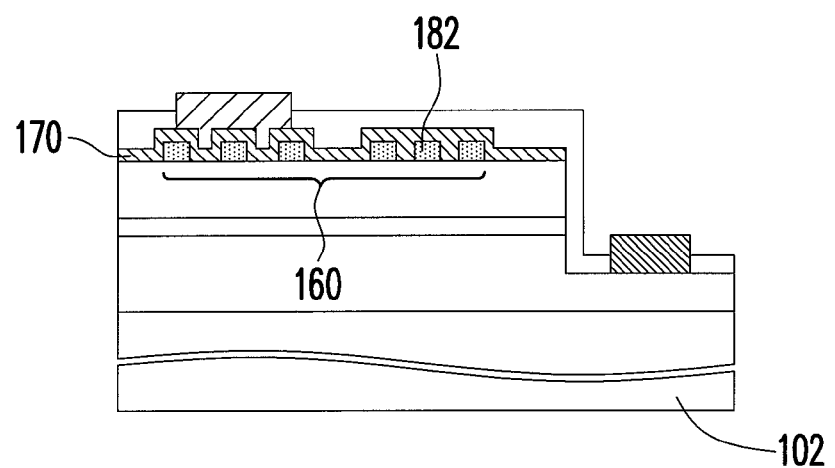
FIG. 3 is a view illustrating an LED according to another embodiment of the present disclosure.

In addition to the above embodiments, according to other embodiments of the present disclosure, the current distribution modifying layer 160 may also be formed using the ohmic contact layer 180 disposed below the metallic reflective layer 170. Please refer to FIG. 3, which is a view illustrating an LED according to another embodiment of the present disclosure. A fabricating method according to the present embodiment is similar to that according to the above embodiment. The biggest difference is that according to the present embodiment, after the step in FIG. 2D is finished, the ohmic contact layer 180 is patterned into a plurality of protrusions 182 to form the current distribution modifying layer 160. The subsequently formed metallic reflective layer 170 directly covers the protrusions formed from the ohmic contact layer 180.

In addition, in the present disclosure, the second semiconductor layer 130 may also be directly patterned to form the current distribution modifying layer 160. Please refer to FIGS. 4A to 4G, which are views illustrating sequentially a process flowchart of an LED according to another embodiment of the present disclosure. The present embodiment uses the same reference numerals for similar components, and omits repeated description.

Figure 4A:
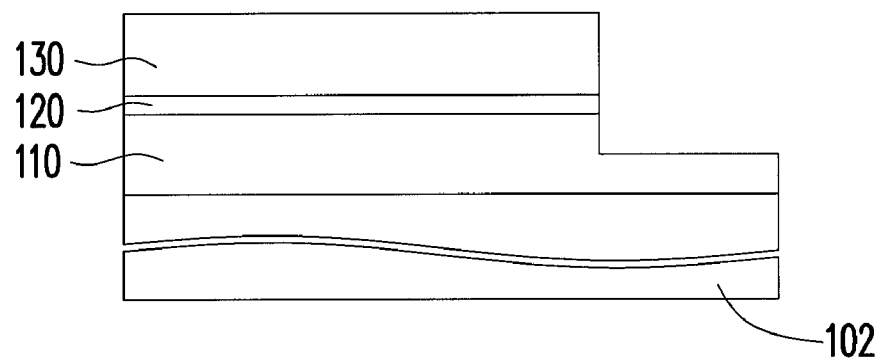
FIGS. 4A to 4G are views illustrating a process flowchart according to an embodiment of the present disclosure.

First, referring to FIG. 4A, the substrate 102 is provided, and the epitaxy method is performed on the substrate. Ion doping is selectively performed to form the first semiconductor layer 110, the active layer 120 and the second semiconductor layer 130 sequentially. As according to the above embodiment, the formed first semiconductor layer 110 and the second semiconductor layer 130 may respectively comprise an N-type doped semiconductor layer and a P-type doped semiconductor layer, or other combinations of layers.

Figure 4B:
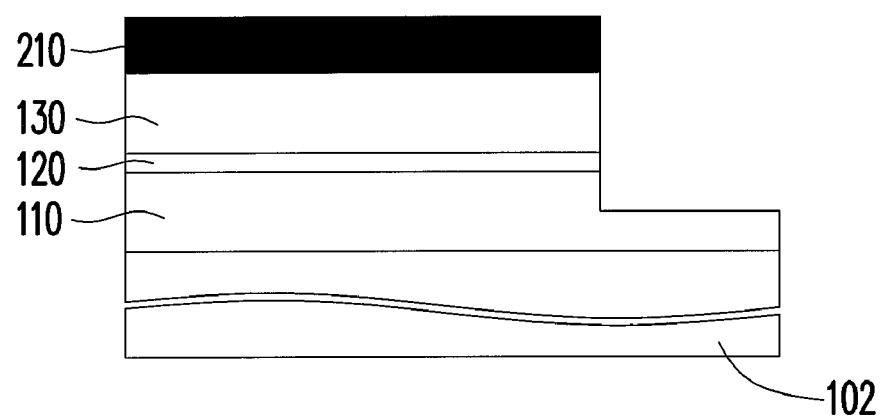

Next, referring to FIG. 4B, parts of the second semiconductor layer 130 and the active layer 120 are removed, so that the part of first semiconductor layer 110 exposed by the second semiconductor layer 130 and the active layer 120 forms the mesa structure. In detail, the mask layer 210, for example a photoresist layer, may be formed on the second semiconductor layer 130. Patterning processes such as etching are performed using the mask layer 210 to remove the parts of the second semiconductor layer 130 and the active layer 120. It should be noted that, during the patterning processes, a part of the first semiconductor layer 110 exposed by the mask layer 210 may be overly etched.

Figure 4C:
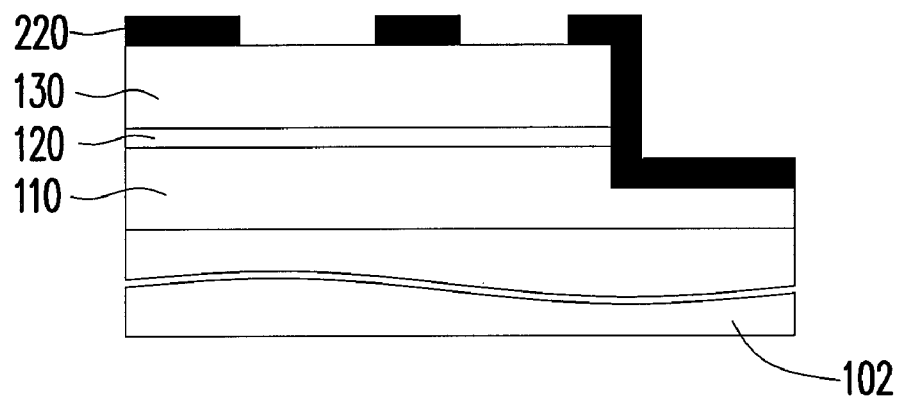

Next, referring to FIG. 4C, the mask layer 210 is removed and another mask layer 220 is formed on the first semiconductor layer 110 and the second semiconductor layer 130. The mask layer 220 is used to define a position of the current distribution modifying layer 160 on the second semiconductor layer 130, and is used as a mask for patterning.

Figure 4D:
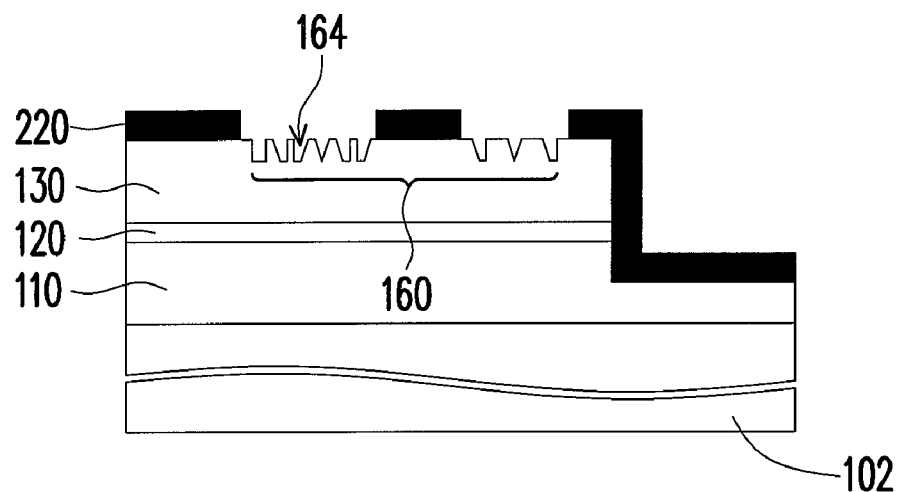

Then, referring to FIG. 4D, using the mask layer, patterning processes, for example etching, are performed on the second semiconductor layer 130 to form a plurality of recesses 164 in the second semiconductor layer 130 to be used as the current distribution modifying layer 160.

Figure 4E:
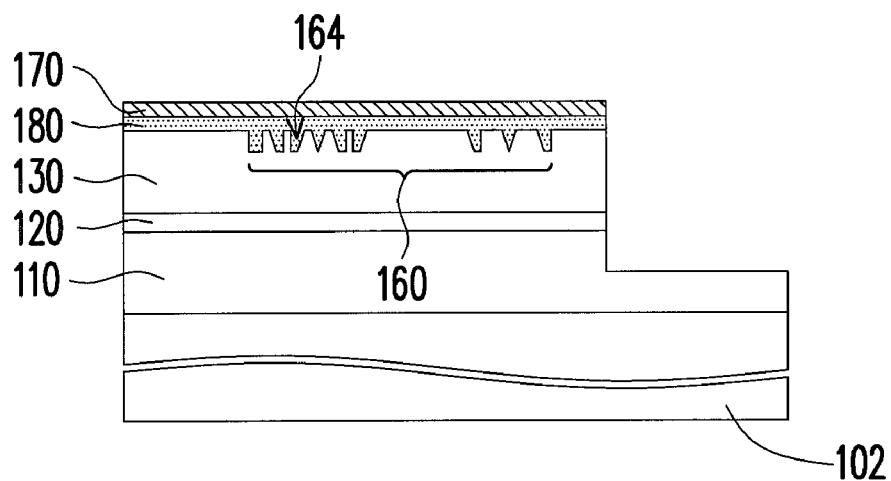

Afterwards, referring to FIG. 4E, the mask layer 220 is removed, and the ohmic contact layer 180 and the metallic reflective layer 170 are selectively formed sequentially on the second semiconductor layer 130 to cover the recesses 164.

Figure 4F:
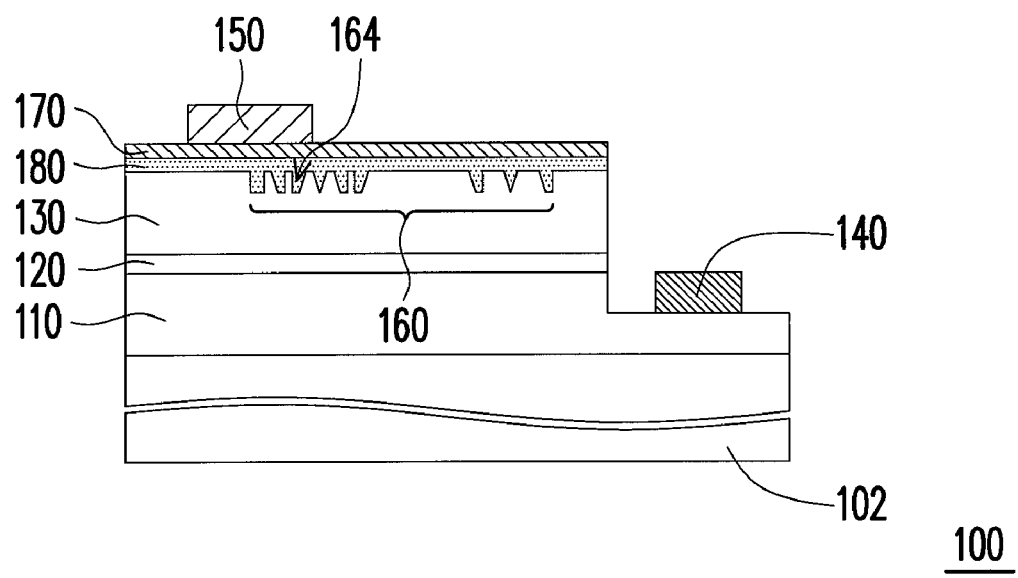

Then, referring to FIG. 4F, the second electrode 150 is formed on the second semiconductor layer 130, so that the second electrode 150 is electrically connected to the second semiconductor layer 130. Furthermore, the first electrode 140 is formed on the first semiconductor layer 110 exposed by the active layer 120 and the second semiconductor layer 130, and the first electrode 140 is electrically connected to the first semiconductor layer 110.

Figure 4G:
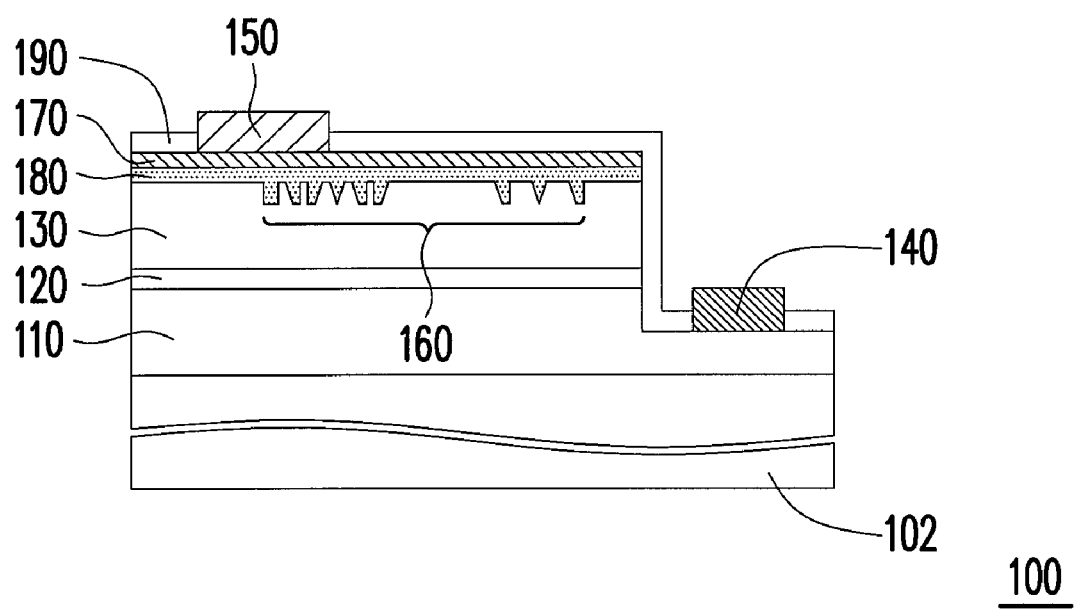

Afterwards, referring to FIG. 4G and according to the present embodiment, the protection layer 190 may be selectively formed to cover the first semiconductor layer 110, the active layer 120 and the second semiconductor layer 130, and expose the first electrode 140 and the second electrode 150. Accordingly, the fabrication of the LED 100 is complete.

Figure 5A:
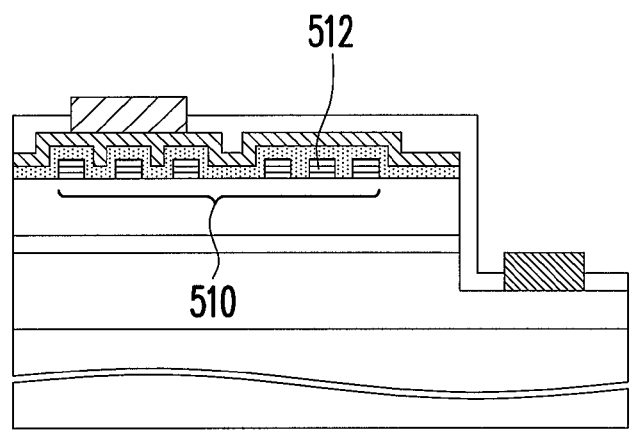
FIGS. 5A to 5J are views illustrating LEDs having different current distribution modifying layer according to embodiments of the present disclosure.
Figure 5B:
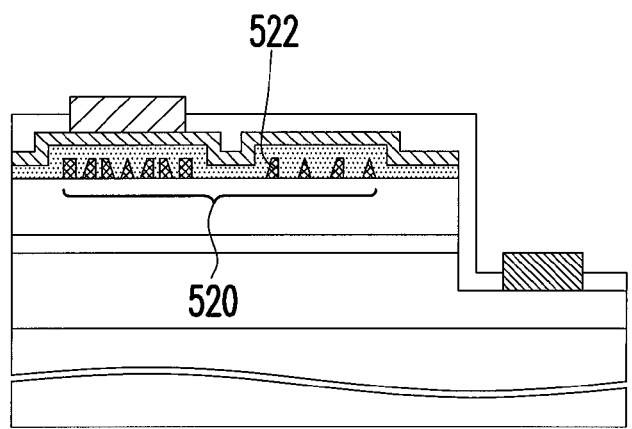
Figure 5C:
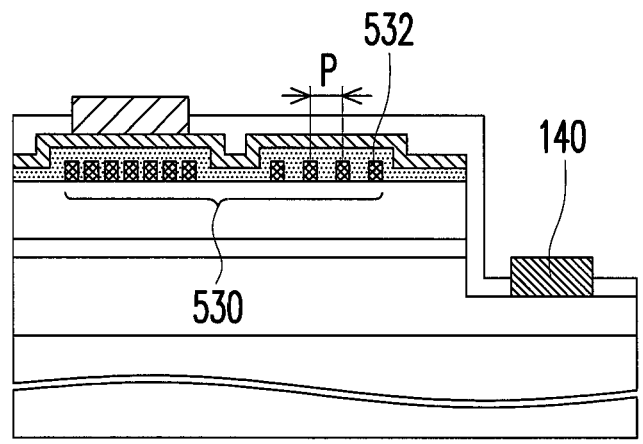
Figure 5D:
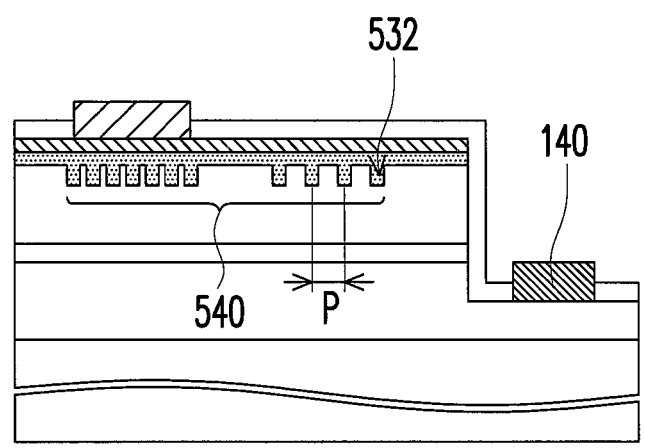
Figure 5E:
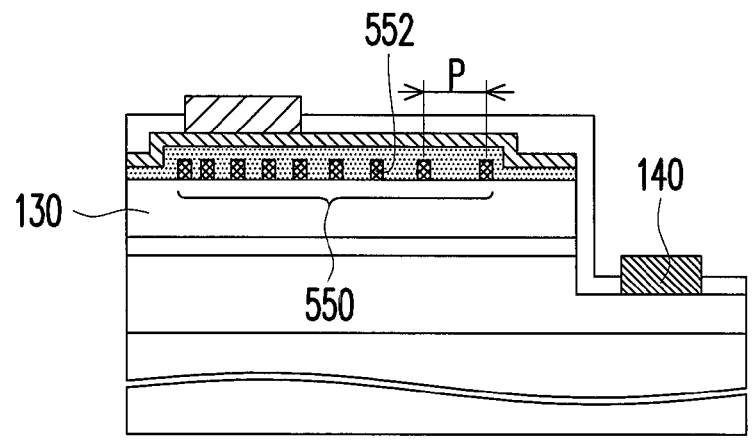

In addition to the above plurality of embodiments, the current distribution modifying layer of the present disclosure can have variations in shape, number or layout. FIGS. 5A to 5E are views illustrating LED structures wherein an insulating material or an ohmic contact material is used to fabricate the current distribution modifying layer. A current distribution modifying layer 510 shown in FIG. 5A comprises a plurality of protrusions 512, wherein each of the protrusion has a multiple layer structure. FIG. 5B is a view illustrating that a current distribution modifying layer 520 comprises a plurality of protrusions 522 of irregular shapes. A current distribution modifying layer 530 shown in FIG. 5C comprises a plurality of protrusions 532, wherein the protrusions 532 have different density distributions in two different areas. In other words, pitches P of the protrusions 532 gradually varies from a position near the first electrode 140 to a position away from the first electrode 140. A current distribution modifying layer 540 shown in FIG. 5D comprises a plurality of recesses 542, wherein the recesses 542 have different density distributions in two different areas. Hence, referring to FIGS. 5C and 5D, the spacing relationships between the protrusions 532 and the recesses 542 may be adjusted according to actual requirements, so that different impedance values are obtained. FIG. 5E further shows a current distribution modifying layer 550 having protrusions 552 arranged from sparse to dense. If a material of the current distribution modifying layer 550 is insulating material, a distribution density of the current distribution modifying layer 550 on the second semiconductor layer 130 preferably increases from a position near the first electrode 140 to a position away from the first electrode 140. In other words, pitches P of the protrusions 552 gradually decrease from the position near the first electrode 140 to the position away from the first electrode 140. Of course, according to other embodiments, the protrusions 552 may be replaced by recesses or have other layouts.

The above mainly exemplifies possible LED structures which use an insulating material or an ohmic contact material to fabricate the current distribution modifying layer. However, in addition to using an insulating material or an ohmic contact material to fabricate the current distribution modifying layer, the current distribution modifying layer may also be fabricated using a conductive material in the present disclosure. A conductive material that may be used is selected, for example, from a group consisting of indium tin oxide (ITO), fluorine doped tin oxide (FTO), aluminum doped zinc oxide (AZO), and gallium doped zinc oxide (GZO). The formed LED structure is also slightly different from that according to the above embodiments.

Figure 5F:
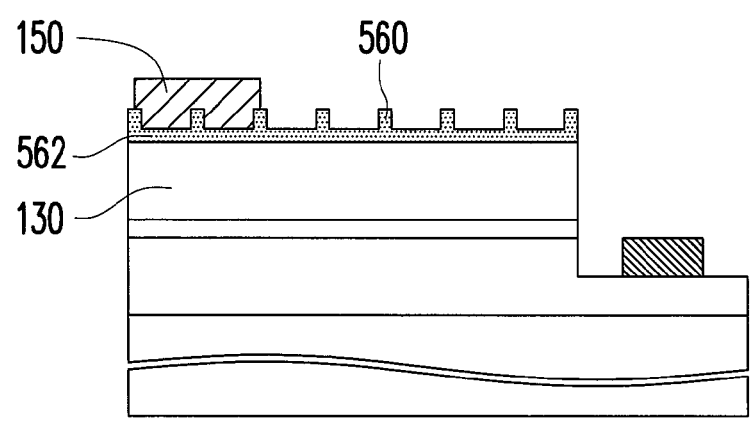
Figure 5G:
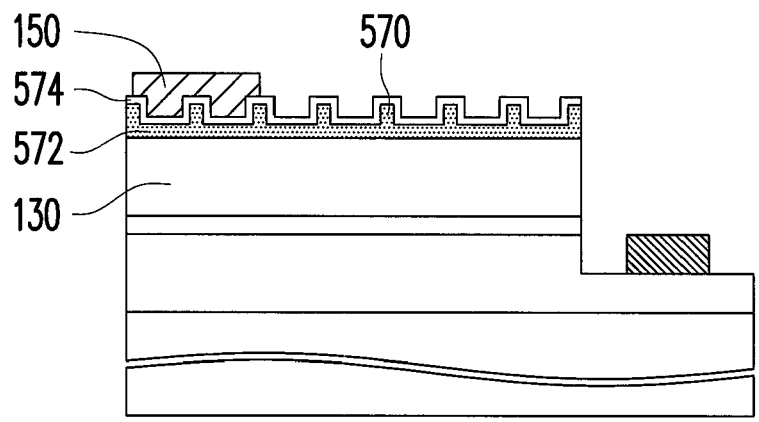
Figure 5H:
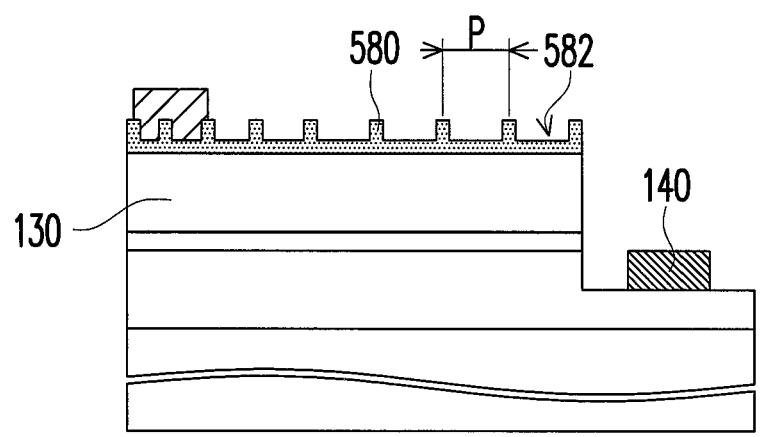
Figure 5I:
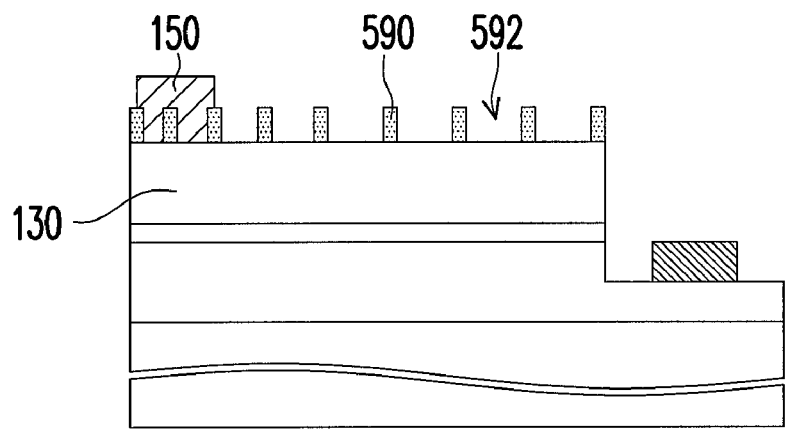
Figure 5J:
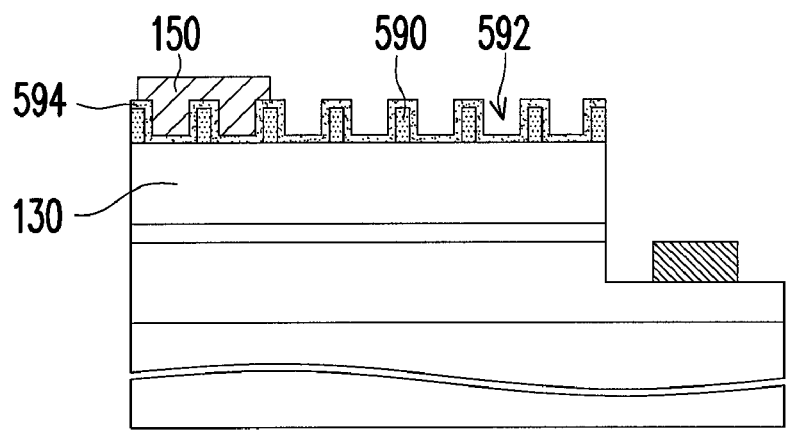

FIGS. 5F to 5J further show LED structures wherein a conductive material is used to fabricate the current distribution modifying layer. A current distribution modifying layer 560 shown in FIG. 5F is plurality of protrusions formed by directly patterning a conductive material layer 562. The second electrode 150 is directly disposed on the conductive material layer 562, so that currents pass into the second semiconductor layer 130 through the conductive material layer 562. FIG. 5G shows that after forming a current distribution modifying layer 570, another conductive material layer 574 covering the current distribution modifying layer 570 and a material layer 572 is formed. Meanwhile, the second electrode 150 passes currents into the second semiconductor layer 130 through the conductive material layers 574 and 572. FIG. 5H show a current distribution modifying layer 580 arranged from sparse to dense, wherein a surface roughening process or nano structure may be performed on an interiors of recesses 582 formed in the current distribution modifying layer 580. According to the present embodiment, since a material of the current distribution modification layer 580 is a conductive material, a density distribution of the current distribution modification layer 580 on the second semiconductor layer 130 preferably increases from a position near the first electrode 140 to a position away from the first electrode 140. In other words, pitches P of the protrusions 582 gradually decrease from the position near the first electrode 140 to the position away from the first electrode 140. Furthermore, referring to FIG. 5I, when fabricating the current distribution modifying layer, the conductive material layer may be further etched through to form a plurality of independent protrusions 590, so that the underneath second semiconductor layer 130 is exposed. The later formed second electrode 150 is connected to the underneath second semiconductor layer 130 through gaps 592 between the protrusions 590. The design in FIG. 5I may also be applied to current distribution modifying layers having a material of an insulating material or a non-ohmic material, so that the second electrode is directly connected downward to the second semiconductor layer. However, the structure as shown in FIG. 5J may be also proposed by forming a conductive layer 594 to cover the protrusions 590. The second electrode 150 is then formed on the conductive layer 594 to connected with the underneath second semiconductor layer 130 through the same. Of course, according to the plurality of above embodiments, the current distribution modifying layer having a material of a conductive material in the present disclosure may also have a concave form, wherein shapes, numbers or distribution densities may be adjusted according to actual requirements.

On the other hand, the LEDs of all of the above or other embodiments may also be combined to a package substrate using a flip chip method to form a package structure.

Figure 6:
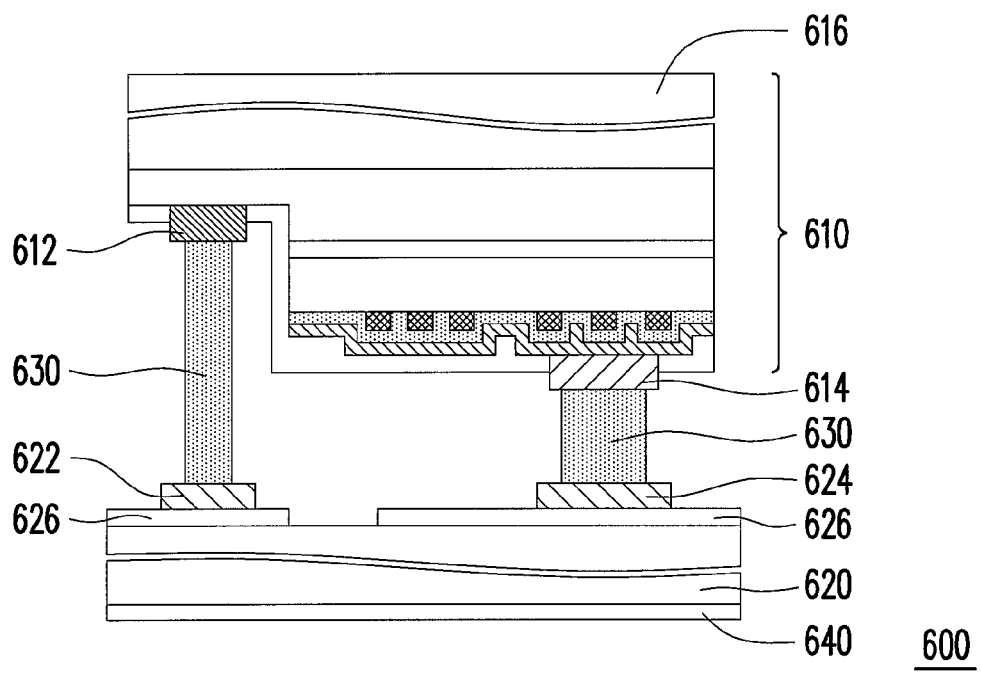
FIG. 6 is a view illustrating a package structure of an LED according to an embodiment of the present disclosure.

FIG. 6 is a view illustrating a package structure of an LED according to an embodiment of the present disclosure. Referring to FIG. 6, a package structure 600 comprises an LED device 610, a package substrate 620 and a plurality of electrical connection units 630. The present LED device 610 may be of various forms according each of the above embodiments or other extended variations. Only one embodiment is used for illustration here, and detailed structures are not repeatedly described. The package substrate 620 comprises a first contact 622 and a second contact 624. A first electrode 612 and a second electrode 614 of the LED device 610 face the first contact 622 and the second contact 624, and are electrically connected to the first contact 622 and the second contact 624 through the electrical connection units 630.

The electrical connection units 630 are, for example, columnar bumps or other units of the same function. A metallic reflective layer may be disposed below the first contact 622 and the second contact 624 to reflect light emitted by the LED device 610, thereby enhancing light emitting efficiency of the whole package structure 600. In addition, a bottom of the package substrate 620 may further comprise a solderable metal layer 640 to be connected to the exterior.

The package substrate 620 may be used to fix the LED device 610 and used as a medium for connecting the LED device 610 and external circuits. Since the LED device 610 emits light from a substrate 616, light is less obstructed by the first electrode 612 and the second electrode 614. Hence light emitting efficiency is enhanced.

Figure 7:
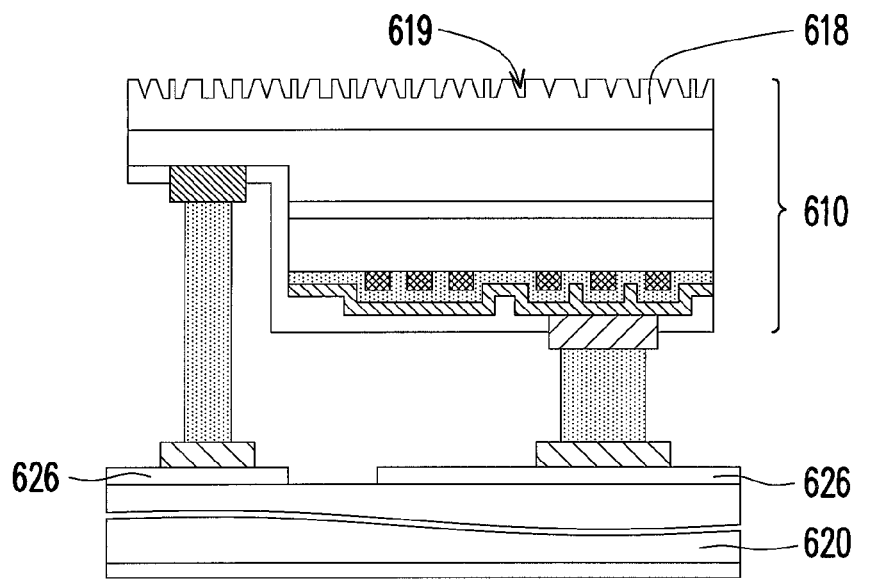
FIG. 7 is a view illustrating a package structure of an LED according to another embodiment of the present disclosure.

In addition, please refer to FIG. 7, which shows a package structure of an LED according to another embodiment of the present disclosure. A package structure 700 according to the present embodiment is partially similar to the package structure 600 according to the previous embodiment. Hence descriptions of similar components are omitted. A more obvious difference between the present embodiment and the previous embodiment is that after the LED device 610 is joined to the package substrate 620, the substrate 616 of the LED device 610, referring to FIG. 6, is further removed to reduce a height of the package structure 700.

In addition, both the package structure 600, referring to FIG. 6, and the package structure 700, referring to FIG. 7, may be further designed according to a light emitting surface of the LED device 610 to adjust light emitting effects. Referring to FIG. 7, a surface of a first semiconductor layer 618 of the LED device 610 has a plurality of recesses 619 and forms a rough surface. Hence, scattering effects of light emitted from the LED device 610 is changed, so that better light emitting efficiency is further achieved. Similarly, referring to FIG. 6, a surface of the substrate 616 of the LED device 610 may have similar structure designs, therefore repeated description is omitted.

The following uses a plurality of embodiments to illustrate changes in an electrode pattern and the current distribution modifying layer in the LED of the present disclosure.

Figure 8A:
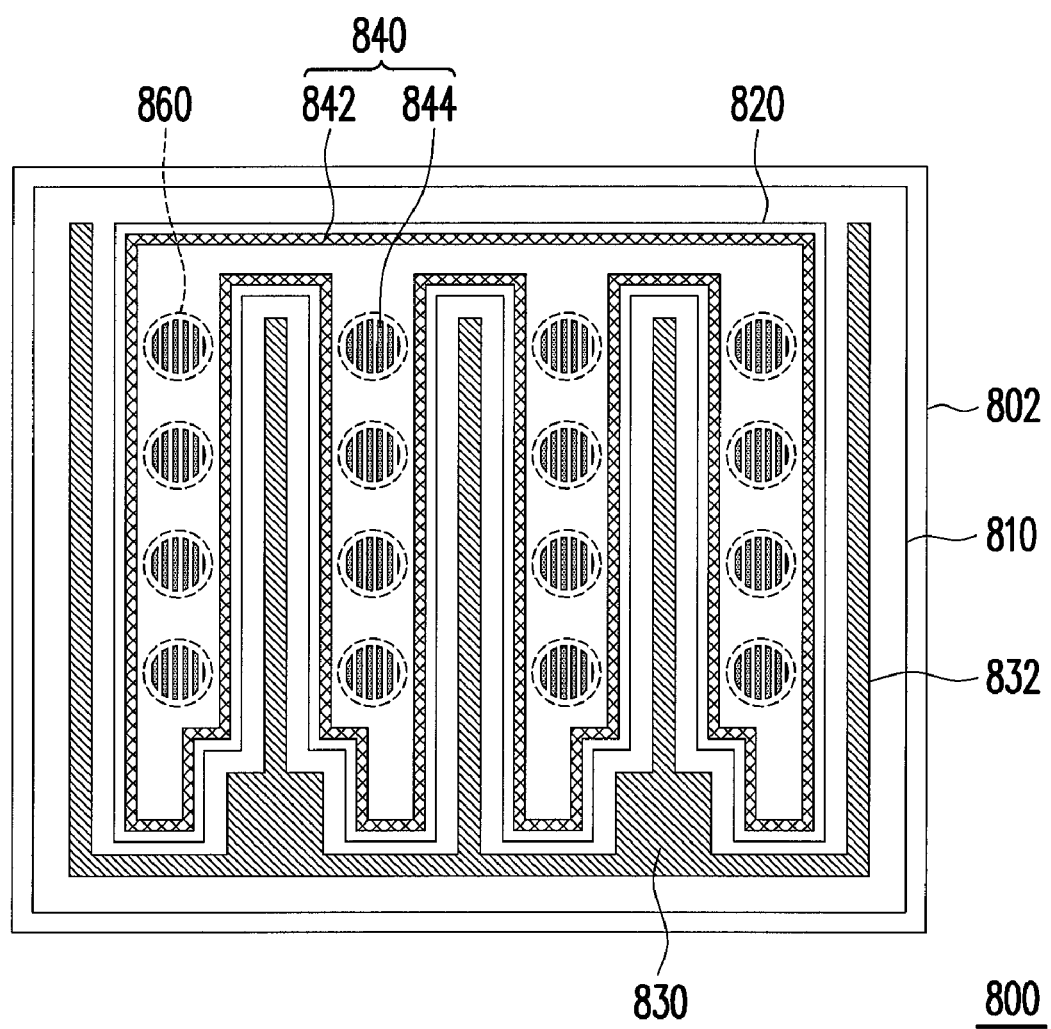
FIGS. 8A and 8B are top views illustrating an LED according to an embodiment of the present disclosure.
Figure 8B:
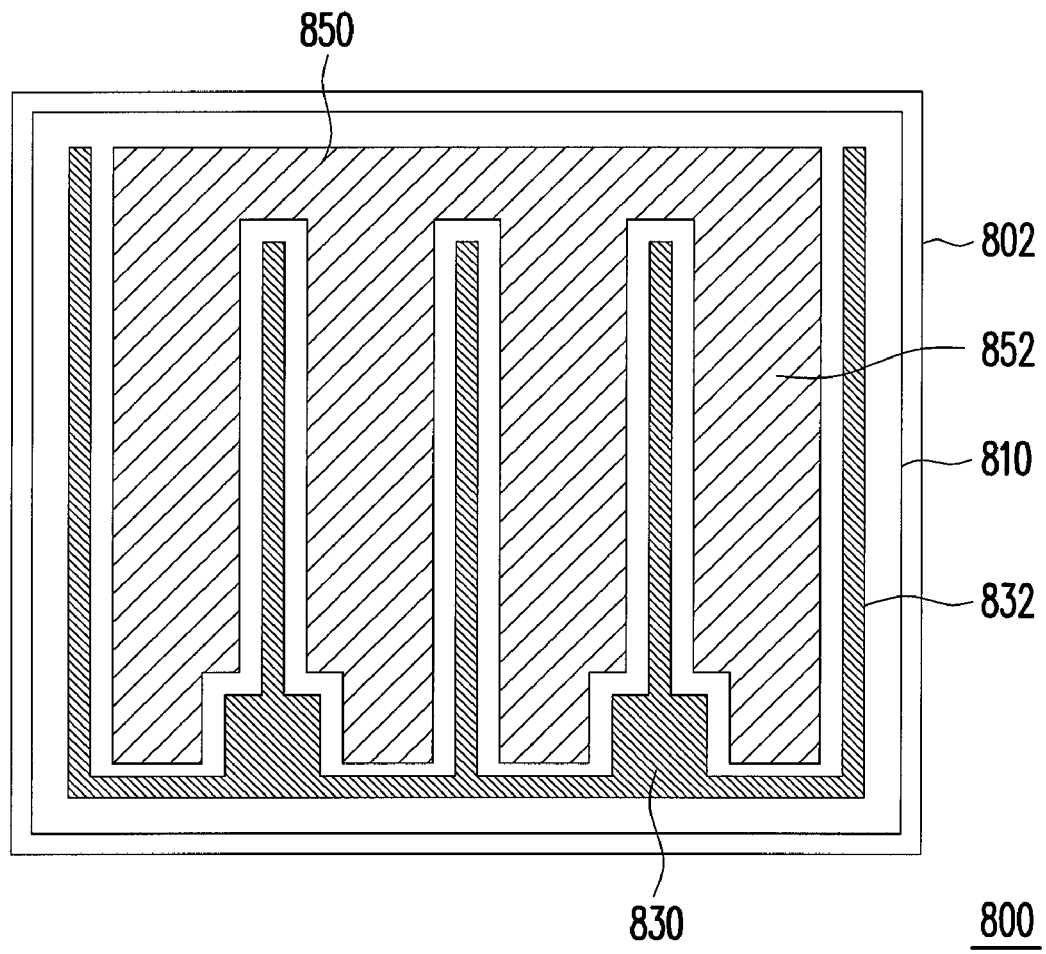

FIGS. 8A and 8B are top views illustrating an LED according to an embodiment of the present disclosure. In order to clearly illustrate figures of relevant layers, FIGS. 8A and 8B omit a part of layers possibly present. FIG. 8A further omits a metallic reflective layer in FIG. 8B. Since the LED according to the present embodiment has similar structures as the LEDs according to the above embodiments, only specific layers are illustrated according to the present embodiment, the rest of layers can be referred to in the above embodiments.

Referring to FIGS. 8A and 8B, in an LED 800, a first semiconductor layer 810 is disposed on a substrate 802, and a mesa structure 820 formed by an active layer and a second semiconductor layer is disposed on the first semiconductor layer 810. In addition, a first electrode 830 is disposed on the first semiconductor layer 810 exposed by the mesa structure 820, and a current distribution modifying layer 840 is disposed on the mesa structure 820. Furthermore, a metallic reflective layer 850 is disposed on the mesa structure 820 and covers the current distribution modifying layer 840. A plurality of second electrodes 860, indicated by dash lines, is also disposed on the metallic reflective layer 850.

According to the present embodiment, the first electrode 830 has a finger structure and comprises a plurality of first branches 832. The mesa structure 820 formed by the active layer and the second semiconductor layer has a finger structure, and the metallic reflective structure 850 disposed on the mesa structure 820 also has a finger structure and comprises a plurality of second branches 852. The first branches 832 of the first electrode 830 and the second branches 852 of the metallic reflective layer 850 are parallel to each other and arranged alternately, so that current distribution is more uniform. The second electrodes 860 are, for example, circular, so that they are collocated with the columnar bumps, referring to FIGS. 6 and 7, during subsequent packaging.

In addition, in order to improve a current distribution in the LED 800, the current distribution modifying layer 840 comprises a first sub pattern 842 and a second sub pattern 844, wherein the first sub pattern 842 circles along an edge of the mesa structure, and the second sub pattern 844 is disposed corresponding to the second electrode 860. According to the present embodiment, the second sub pattern 844 is, for example, a circular slit pattern.

However, the current distribution modifying layer differs according to a structure of the LED. In an actual process, the LED may be measured before the current distribution modifying layer is disposed, and then disposing the current distribution modifying layer on suitable positions according to light intensities.

Figure 9A:
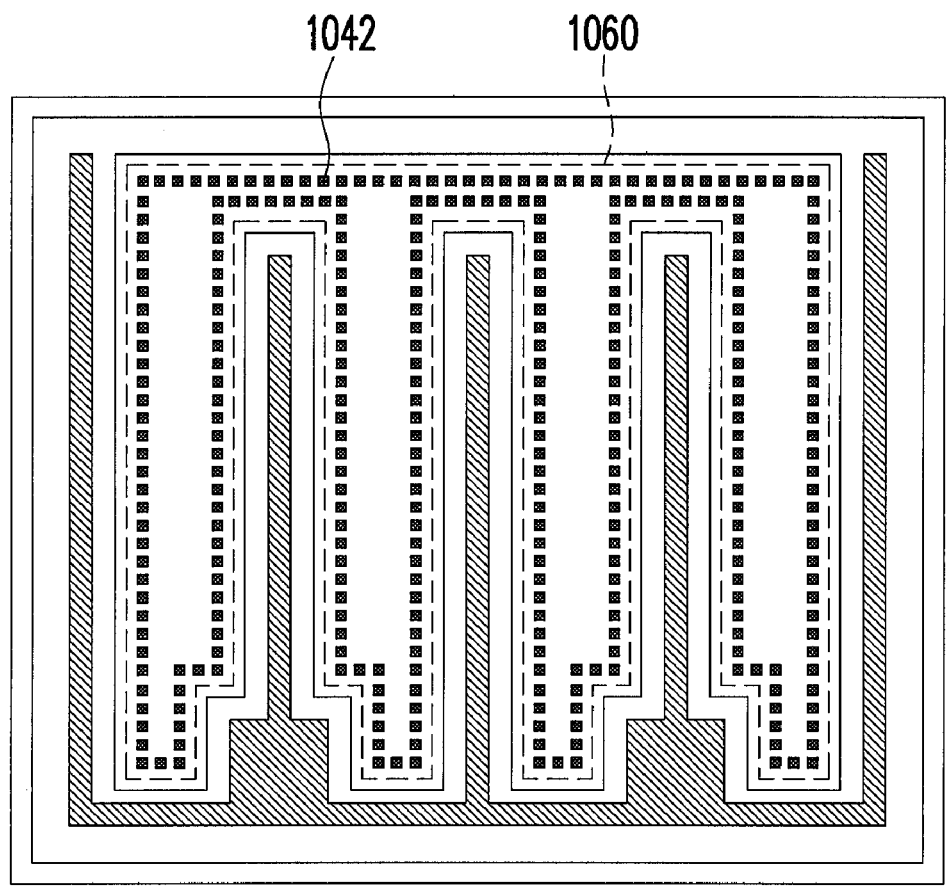
FIGS. 9A and 9B are views illustrating an LED according to still another embodiment of the present disclosure.
Figure 9B:
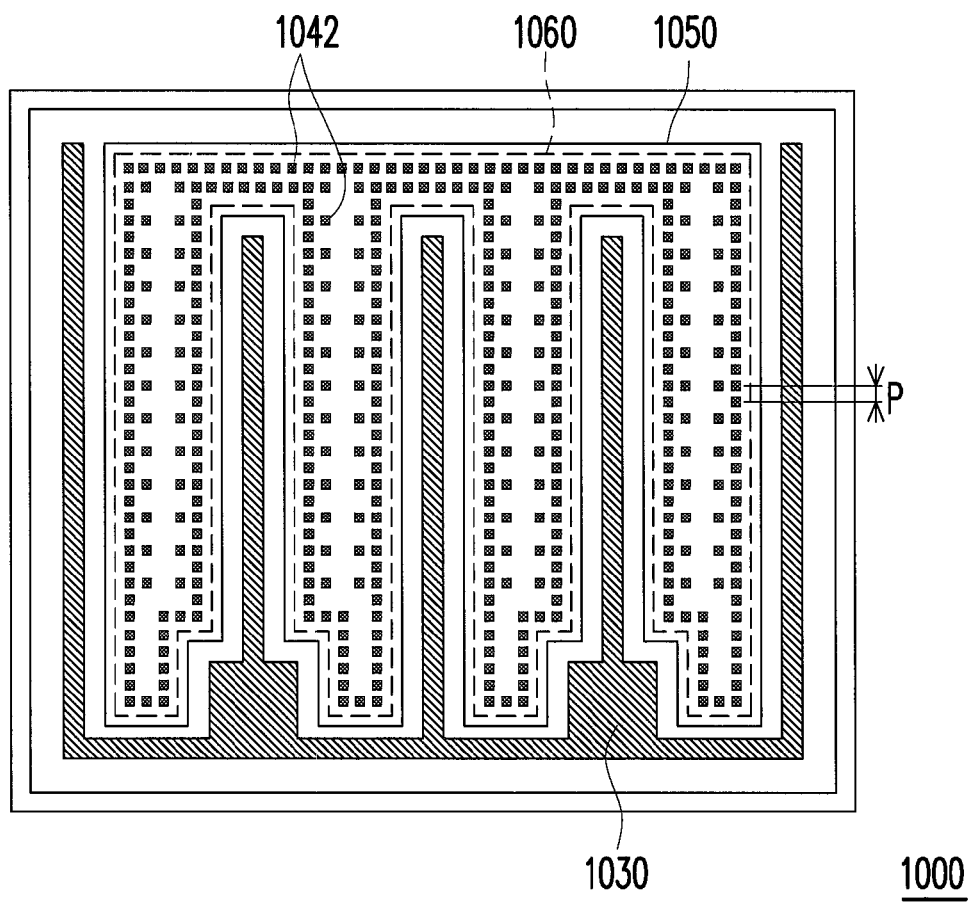

Refer to both FIGS. 9A and 9B, which are views respectively illustrating an LED according to still another embodiment of the present disclosure. In order to clearly illustrate figures of relevant layers, FIGS. 9A and 9B omit a part of layers possibly present and use dash lines to represent a second electrode disposed on a current distribution modifying layer. Since the LED according to the present embodiment has similar structures as the LEDs according to the above embodiments, only specific layers are illustrated according to the present embodiment, the rest of layers can be referred to in the above embodiments.

Referring to FIG. 9A, considering that an edge of a second electrode 1060 has higher current densities, a current distribution modifying layer having a material of an insulating material is disposed on the edge of the second electrode 1060. The current distribution modifying layer comprises a plurality of block patterns 1042, disposed along the second electrode 1060 to avoid currents being overly concentrated on the edge of the second electrode 1060, thereby improving a current distribution effect of an LED 1000.

In addition, referring to FIG. 9B, the block patterns 1042 may also be disposed under the second electrodes 1060, and distribution densities of the block patterns 1042 are adjusted according to actual current distributions. For example, the current may be concentrated on the edge of the second electrode 1060. If a material of the block patterns is an insulating material, then the block patterns 1042 near the edge of the second electrodes 1060 are distributed more densely, and the block patterns disposed in a central region of the second electrode 1060 are distributed more sparsely. In other words, referring to FIG. 5E which shows a distribution of the current distribution modifying layer according to an embodiment, the current distribution modifying layer (the block patterns 1042) on a second semiconductor layer 1050 has a distribution density gradually decreasing from a position near a first electrode 1030 to a position away from the first electrode 1030. In other words, pitches P of the protrusions 1042 gradually increase from the position near the first electrode 1030 to the position away from the first electrode 1030.

Please refer to FIGS. 10 to 13, which are views illustrating LEDs according to other embodiments of the present disclosure. The LEDs shown in FIGS. 10 to 13 adopt current distribution modifying layers having mesh patterns. In order to clearly illustrate figures of relevant layers, FIGS. 10-13 omit a part of layers possibly present, and referring to FIGS. 12 and 13, dash lines are used to represent second electrodes disposed on current distribution modifying layers. Since the LED according to the present embodiment has similar structures as the LEDs according to the above embodiments, only specific layers are illustrated according to the present embodiment, the rest of layers can be referred to in the above embodiments.

Figure 10:
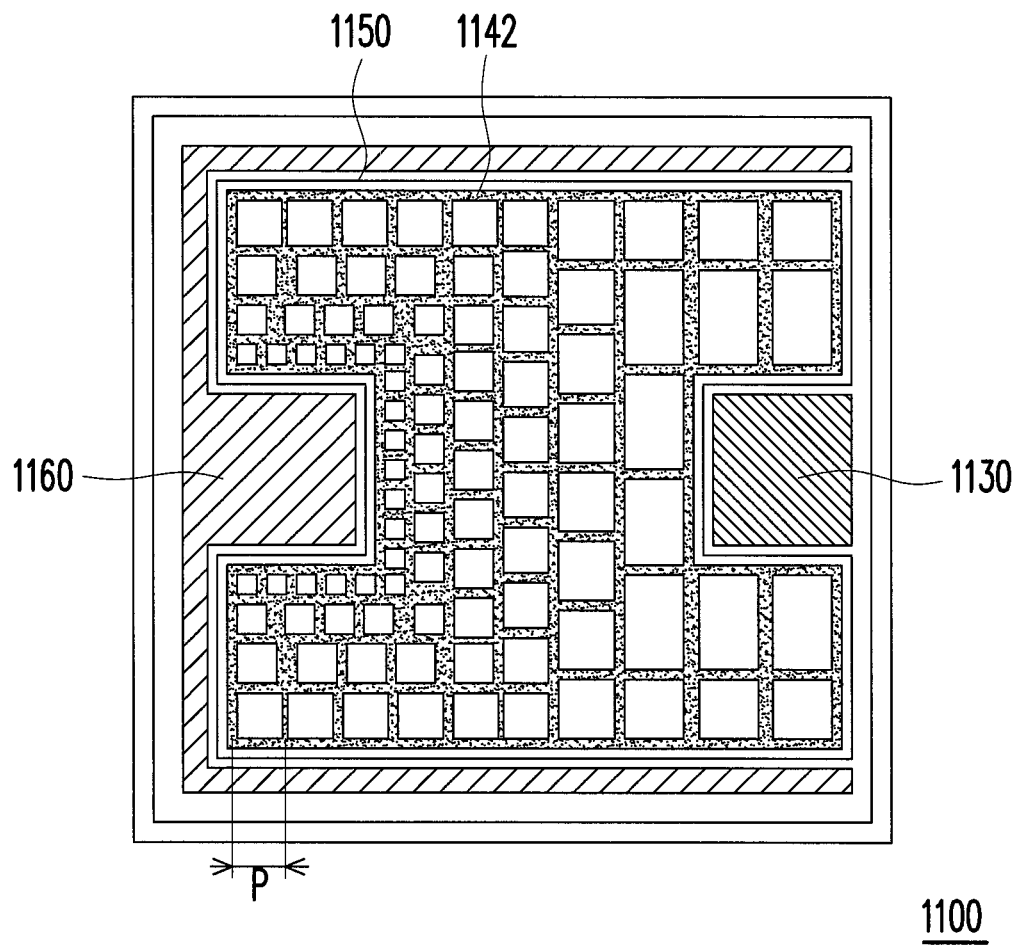
FIGS. 10 to 13 are views illustrating LEDs according to other embodiments of the present disclosure.

Please refer to FIG. 10, which is a view illustrating an LED 1100 having a first electrode 1130 and a second electrode 1160 having block patterns. According to the present embodiment, a current distribution modifying layer 1142 has a material of conductive material, and has a mesh pattern. Considering that an edge of the second electrode 1160 has higher current density, according to the present embodiment, a distribution density of the current distribution modifying layer 1142 on a second semiconductor layer 1150 increases from a position near the first electrode 1130 to a position away from the first electrode 1130. In other words, pitches P of the current distribution modifying layer 1142 gradually decrease from the position near the first electrode 1130 to the position away from the first electrode 1130.

Figure 11:
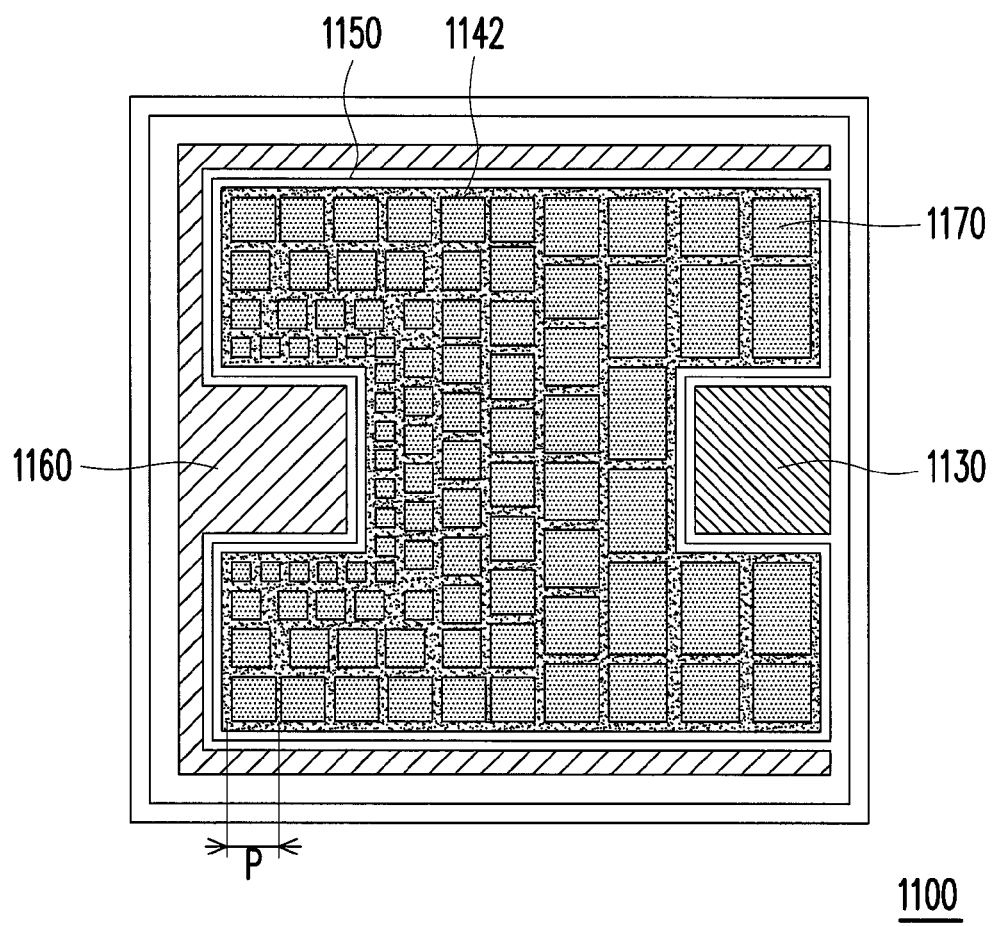

Otherwise, referring to FIG. 11, another structure of LED similar to that of FIG. 10 is further illustrated herein. According to the present embodiment, the current distribution modifying layer 1142 has a material of conductive material, and has a mesh pattern. Considering that the edge of the second electrode 1160 has higher current density, according to the present embodiment, the distribution density of the current distribution modifying layer 1142 on a second semiconductor layer 1150 increases from a position near the first electrode 1130 to a position away from the first electrode 1130. In other words, pitches P of the current distribution modifying layer 1142 gradually decrease from the position near the first electrode 1130 to the position away from the first electrode 1130. Furthermore, micro or nano structures 1170, such as photonic crystals or rough surfaces, are formed on the second semiconductor layer 1150 exposed by the current distribution modifying layer 1142 to improve the current distribution effect of the LED 1100.

Figure 12:
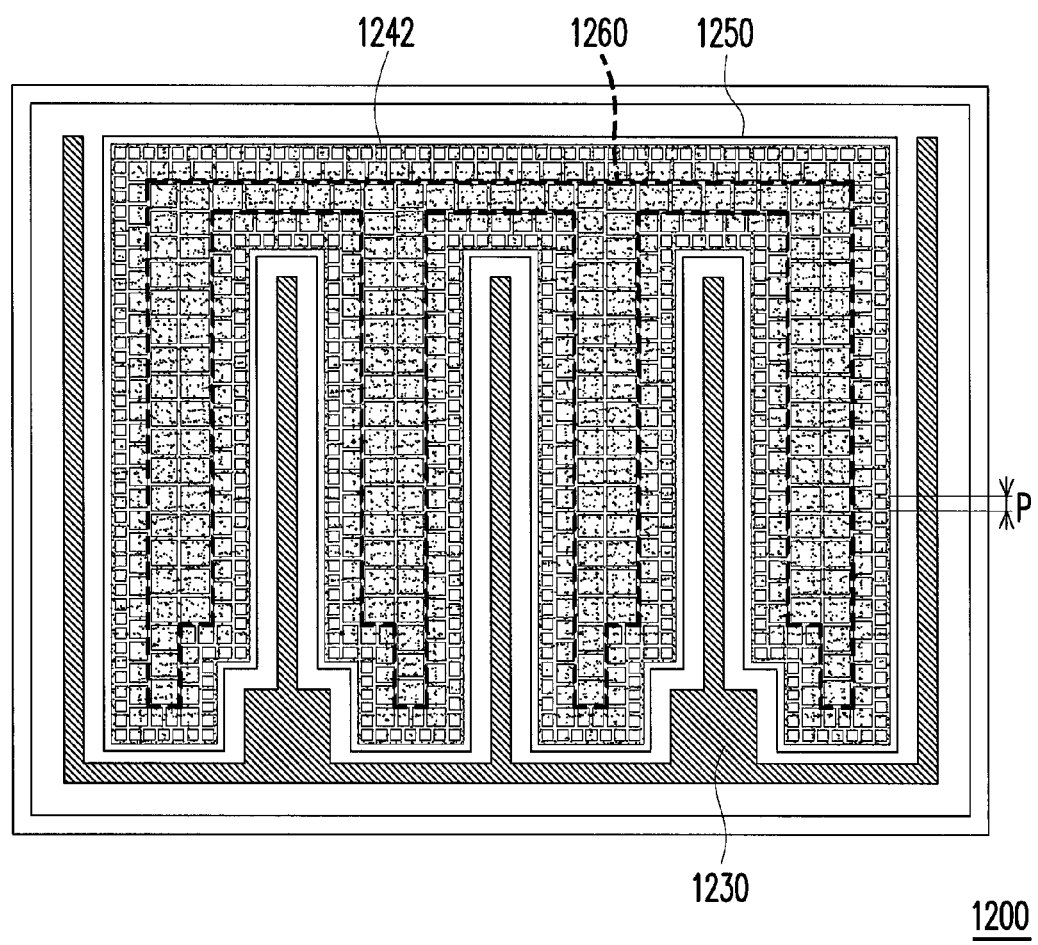

Please refer to FIG. 12, which is a view illustrating an LED 1200 having a first electrode 1230 and a second electrode 1260 having finger structures. According to the present embodiment, a current distribution modifying layer 1242 has a material of an insulating material, and has a mesh pattern. Considering that an edge of the second electrode 1260 has higher current density, according to the present embodiment, a distribution density of the current distribution modifying layer 1242 on a second semiconductor layer 1250 gradually decreases from a position near the first electrode 1230 to a position away from the first electrode 1230. In other words, pitches P of the current distribution modifying layer 1242 gradually increase from the position near the first electrode 1230 to the position away from the first electrode 1230.

Figure 13:
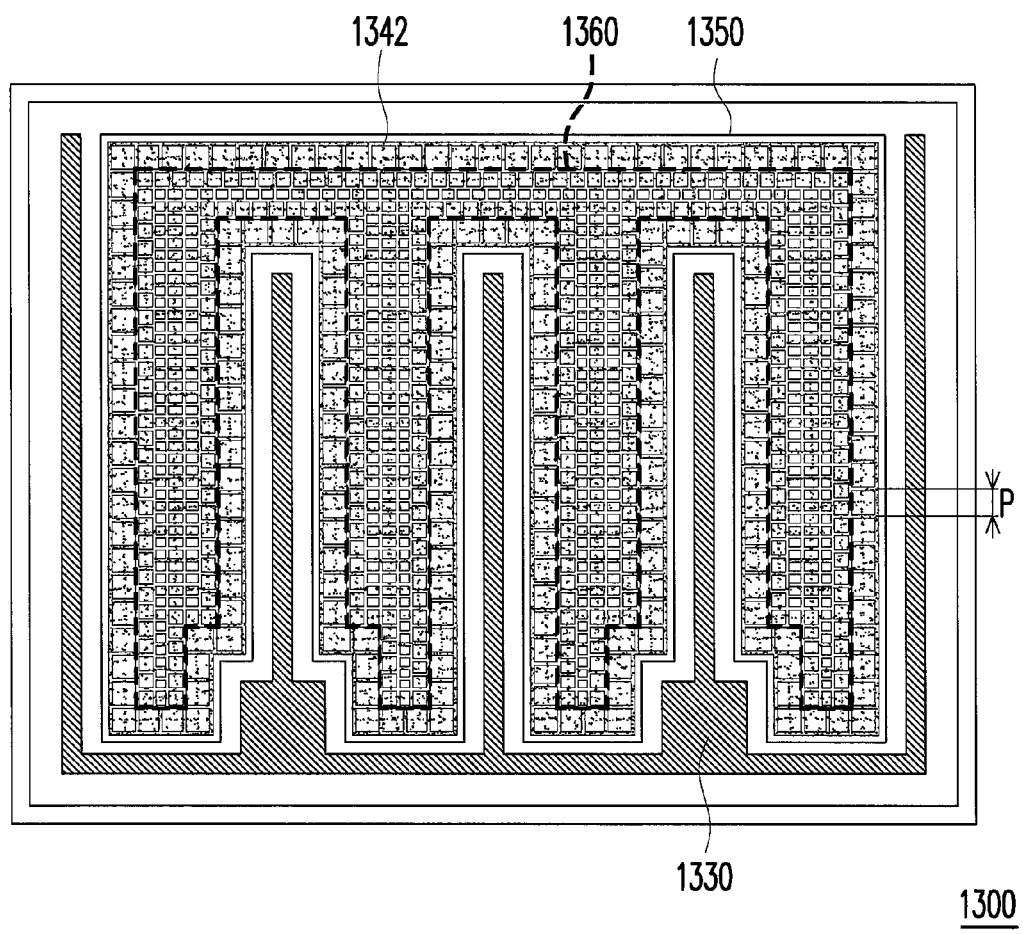

Compared with the current distribution modifying layer having a material of an insulating material shown in FIG. 12, an LED that has a current distribution modifying layer having a mesh structure and having a material of a conductive material is shown in FIG. 13. Referring to FIG. 13, a current distribution modifying layer 1342 has a material of a conductive material, and has a mesh pattern. Considering that an edge of a second electrode 1360 has higher current density and the current distribution modifying layer 1342 conducts electricity, according to the present embodiment, a distribution density of the current distribution modifying layer 1342 on a second semiconductor layer 1350 increases from a position near the first electrode 1330 to a position away from the first electrode 1330, so that a current distribution of an LED 1300 is improved. In other words, pitches P of the current distribution modifying layer 1142 gradually decrease from the position near the first electrode 1130 to the position away from the first electrode 1130.

Figure 14:
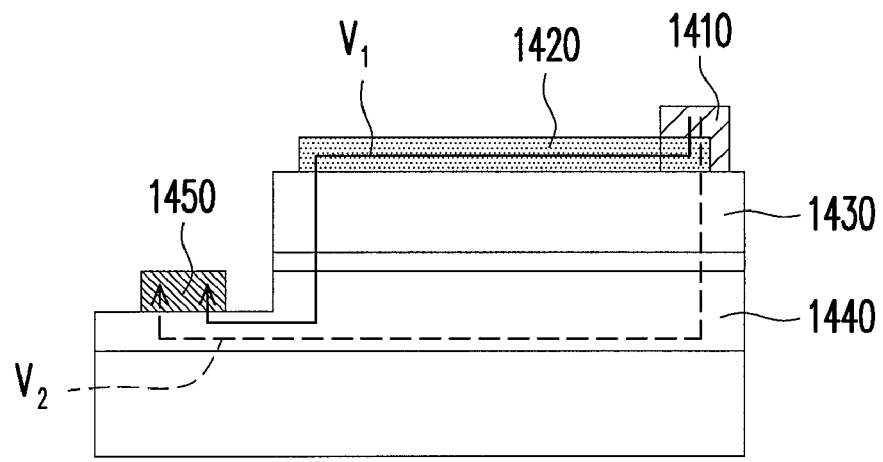
FIG. 14 shows a conventional LED without a current distribution modifying layer.

According to the above disclosure, a conclusion is provided in the following. FIG. 14 shows a conventional LED without a current distribution modifying layer as proposed herein. Referring to FIG. 14, $V_1$ is a voltage drop of a current from the second electrode 1410, transmitted through a conductive layer 1420 over the second semiconductor layer 1430, to the first electrode 1440 on the first semiconductor layer 1450. $V_2$ is a voltage drop of a current from the second electrode 1410, transmitted downward and through the first semiconductor layer 1440, to the first electrode 1450. Since currents are not uniform when the LED is driven, $V_1$ and $V_2$ are not equal.

Figure 15:
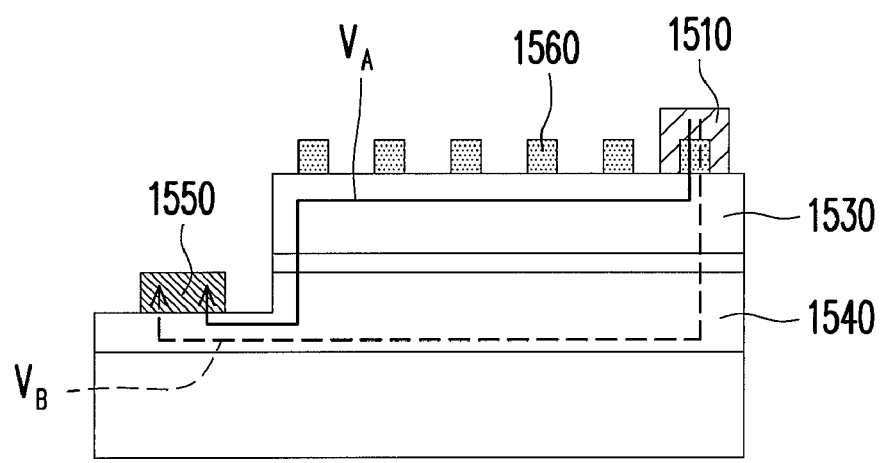
FIG. 15 shows an LED provided with a current distribution modifying layer.

Further referring to FIG. 15, by forming a current distribution modifying layer 1560 on the second semiconductor layer 1530, difference between $V_1$ and $V_2$ as shown in FIG. 14 can be compensated. Therefore, in the LED as proposed herein, $V_A$ being a voltage drop of a current from the second electrode 1510, transmitted through the current distribution modifying layer 1560, to the first electrode 1550, can be effectively maintained to be equal to $V_B$ being a voltage drop of a current from the second electrode 1510, transmitted downward and through the first semiconductor layer 1540, to the first electrode 1550.

To achieve the above effects, various types of current distribution modifying layers are proposed in the aforementioned embodiment. To sum up, the current distribution modifying layer can be insulating or conductive. In addition, the distribution density of the current distribution modifying layer on the second semiconductor layer may be gradually increases from a position near the first electrode to a position away from the first electrode, or gradually decreases from a position near the first electrode to a position away from the first electrode.

Specifically, referring to FIG. 5E, in a case of $V_1 > V_2$, the current distribution modifying layer 550 can be made of insulating material with the distribution density gradually increasing from a position near the first electrode 140 to a position away from the first electrode 140. However, in the same case of $V_1 > V_2$, the current distribution modifying layer can further be made of conductive material with the distribution density gradually decreasing from a position near the first electrode to a position away from the first electrode.

Furthermore, referring to FIGS. 5H and 5I, in a case of $V_1 < V_2$, the current distribution modifying layers 580 and 590 can be made of conductive material with the distribution density gradually increasing from a position near the first electrode 140 to a position away from the first electrode 140. However, in the same case of $V_1 < V_2$, the current distribution modifying layer can further be made of insulating material with the distribution density gradually decreasing from a position near the first electrode to a position away from the first electrode.

In summary, the present disclosure provides the LED of superb light emitting efficiency and high reliability, package structure and fabricating method thereof. When the LED is driven, by forming the current distribution modifying layer on a suitable position on the LED, the current distribution in the LED is adjusted, so that light emitting efficiency of the LED is enhanced. The current distribution modifying layer can be a layer inherent in the LED or be additionally formed from another layer. Since the current distribution modifying layer avoids letting currents be overly concentrated, situations in which the LED is damaged by concentrated currents or heat generated thereof are avoided. Additionally, by performing the flip chip packaging method to the LED, the light emitted from the LED is not obstructed by the electrodes or other non-transparent layers, leading to better light emitting efficiencies. If the substrate of the LED is removed, a height of the package structure may be further reduced. Furthermore, the light emitting surface of the LED may be designed, for example, as a rough surface, so that uniform light emitting effects are provided.

Although the present disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A light emitting diode, comprising:
   a substrate;
   a first semiconductor layer, disposed on the substrate;
   an active layer, disposed on the first semiconductor layer;
   a second semiconductor layer, disposed on the active layer, wherein the active layer and the second semiconductor layer form a mesa structure, and the mesa structure exposes a part of the first semiconductor layer;
   a current distribution modifying layer, comprising a plurality of patterns disposed on the second semiconductor layer, wherein pitches of the patterns gradually decrease or increase from a position near the first electrode to a position away from the first electrode;
   a first electrode, disposed on the first semiconductor layer exposed by the mesa structure and electrically connected to the first semiconductor layer; and
   a second electrode, disposed on the current distribution modifying layer and electrically connected to the second semiconductor layer.

2. The light emitting diode of claim 1, wherein the current distribution modifying layer is insulating.

3. The light emitting diode of claim 1, wherein the current distribution modifying layer is conductive.

4. The light emitting diode of claim 1, wherein $V_A$ is a voltage drop of a current from the second electrode, transmitted through the current distribution modifying layer, to the first electrode, $V_B$ is a voltage drop of a current from the second electrode, transmitted downward and through the first semiconductor layer, to the first electrode, and $V_A$ is equal to $V_B$.

5. The light emitting diode of claim 1, further comprising a metallic reflective layer disposed between the second electrode and the second semiconductor layer and covering the current distribution modifying layer.

6. The light emitting diode of claim 5, further comprising an ohmic contact layer disposed between the metallic reflective layer and the second semiconductor layer and covering the current distribution modifying layer.

7. The light emitting diode of claim 5, wherein the patterns comprises a plurality of protrusions disposed on the second semiconductor layer, and a material of the protrusions is an insulating material.

8. The light emitting diode of claim 7, wherein a material of the protrusions is selected from a group consisting of $SiO_2$, $SiN_x$, AlN, SiOxNy and $Ga_2O_3$.

9. The light emitting electrode of claim 5, wherein a material of the patterns is an ohmic contact material.

10. The light emitting electrode of claim 5, wherein the patterns comprises a plurality of recesses disposed on the second semiconductor layer.

11. The light emitting diode of claim 1, wherein the patterns comprises a plurality of protrusions disposed on the second semiconductor layer, and a material of the protrusions is a conductive material.

12. The light emitting diode of claim 11, wherein the material of the patterns is selected from a group consisting of indium tin oxide (ITO), fluorine doped tin oxide (FTO), aluminum doped zinc oxide (AZO), and gallium doped zinc oxide (GZO).

13. The light emitting diode of claim 1, wherein the first electrode has a finger structure and comprises a plurality of first branches, and the mesa structure has a finger structure and comprises a plurality of second branches, the first branches and the second branches being parallel to each other and arranged alternately.

14. The light emitting diode of claim 1, wherein the current distribution modifying layer is formed by patterning a laminated material layer.

15. The light emitting diode of claim 1, further comprising a protection layer covering the first semiconductor layer and the mesa structure and exposing the first electrode and the second electrode.

16. The light emitting diode of claim 1, wherein the patterns comprise first sub patterns disposed along an edge of the second semiconductor layer.

17. The light emitting diode of claim 16, wherein the patterns further comprise second sub patterns disposed under the second electrode.

18. The light emitting diode of claim 17, wherein the second sub patterns comprise a plurality of slit patterns.

19. The light emitting diode of claim 1, wherein the patterns comprises a plurality of block patterns or a mesh.